US012690439B2

(12) United States Patent
Fang et al.

(10) Patent No.: US 12,690,439 B2
(45) Date of Patent: Jul. 21, 2026

(54) SEMICONDUCTOR STRUCTURE FOR REDUCING RLC PARASITIC PARAMETERS AND MANUFACTURING METHOD THEREOF

(71) Applicant: CHANGXIN MEMORY TECHNOLOGIES, INC., Hefei City (CN)

(72) Inventors: Yuan Fang, Hefei (CN); Yanwu Wang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 485 days.

(21) Appl. No.: 18/366,814

(22) Filed: Aug. 8, 2023

(65) Prior Publication Data
US 2024/0096754 A1     Mar. 21, 2024

Related U.S. Application Data

(63) Continuation of application No. PCT/CN2022/123988, filed on Oct. 9, 2022.

(30) Foreign Application Priority Data

Sep. 19, 2022     (CN) .......................... 202211138703.1

(51) Int. Cl.
*H10W 20/20*          (2026.01)
*H10W 20/44*          (2026.01)
(Continued)

(52) U.S. Cl.
CPC ....... *H10W 20/20* (2026.01); *H10W 20/4421* (2026.01); *H10W 70/611* (2026.01);
(Continued)

(58) Field of Classification Search
CPC ............. H10W 20/20; H10W 20/4421; H10W 70/611; H10W 70/65; H10W 90/00;
(Continued)

(56) References Cited

U.S. PATENT DOCUMENTS 9,941,252 B2     4/2018 Lee
10,256,215 B2     4/2019 Lee
(Continued)

FOREIGN PATENT DOCUMENTS

CN          107507825 A     12/2017
CN          112117258 A     12/2020
(Continued)

OTHER PUBLICATIONS

International Search Report in the international application No. PCT/CN2022/123988, mailed on Mar. 15, 2023. 3 Pages.

*Primary Examiner* — Norman D Richards
*Assistant Examiner* — Laura M Dykes
(74) *Attorney, Agent, or Firm* — Syncoda LLC; Feng Ma

(57)          ABSTRACT

A semiconductor structure includes a base, a chip stack located on the base, and first conductive structures. The chip stack includes chips stacked in sequence in a direction perpendicular to a plane of the base, a chip includes first and second sub-portions, a first surface of the first sub-portion is flush with that of the second sub-portion, a second surface of the first sub-portion protrudes from that of the second sub-portion, and the first and second surfaces are oppositely arranged. A first conductive structure includes a first conductive bump and a first through-silicon via, the first conductive bump is located between first sub-portions of two adjacent chips, the first through-silicon via penetrates through the first sub-portion in the direction perpendicular to the plane of the base and is connected to the first conductive
(Continued)

bump, and the materials of the first conductive bump and the first through-silicon via are same.

14 Claims, 6 Drawing Sheets

(51) Int. Cl.
  *H10W 70/60* (2026.01)
  *H10W 70/65* (2026.01)
  *H10W 90/00* (2026.01)
  *H10W 72/20* (2026.01)
(52) U.S. Cl.
  CPC ........... *H10W 70/65* (2026.01); *H10W 90/00* (2026.01); *H10W 72/265* (2026.01); *H10W 72/267* (2026.01); *H10W 90/722* (2026.01); *H10W 90/724* (2026.01)
(58) Field of Classification Search
  CPC ............. H10W 72/265; H10W 72/267; H10W 90/722; H10W 90/724; H10W 90/297
  USPC ......................................................... 257/744
  See application file for complete search history.

(56) References Cited

U.S. PATENT DOCUMENTS

| | | | | |
|---|---|---|---|---|
| 10,497,688 | B2 * | 12/2019 | Tsukiyama | ............ H10W 90/00 |
| 10,665,571 | B2 | 5/2020 | Lee | |
| 11,393,764 | B2 | 7/2022 | Nam et al. | |
| 2002/0033531 | A1 * | 3/2002 | Matsushima | ..... H10W 72/0198 |
| | | | | 257/734 |
| 2010/0258936 | A1 * | 10/2010 | Kim | ...................... H10W 99/00 |
| | | | | 257/692 |
| 2011/0291267 | A1 | 12/2011 | Wang | |
| 2011/0291268 | A1 | 12/2011 | Wang | |
| 2012/0267776 | A1 * | 10/2012 | Nin | ........................ H10W 20/40 |
| | | | | 257/737 |
| 2017/0358558 | A1 | 12/2017 | Lee | |
| 2018/0166420 | A1 * | 6/2018 | Park | ...................... H10W 90/00 |
| 2018/0211937 | A1 | 7/2018 | Lee | |
| 2019/0206844 | A1 | 7/2019 | Lee | |
| 2022/0181299 | A1 * | 6/2022 | Kim | ..................... H10D 62/117 |

FOREIGN PATENT DOCUMENTS

| | | | |
|---|---|---|---|
| CN | | 112864109 A | 5/2021 |
| CN | | 114496960 A | 5/2022 |
| CN | | 114497019 A | 5/2022 |

* cited by examiner

Providing a base ⟋501

Forming a chip stack on the base, in which the chip stack body includes a plurality of chips stacked in sequence in a direction perpendicular to a plane of the base, a chip includes a first sub-portion and a second sub-portion, a first surface of the first sub-portion is flush with a first surface of the second sub-portion, and the first surface of the first sub-portion and the first surface of the second sub-portion are oppositely arranged to the second surface of the first sub-portion and the second surface of the second sub-portion ⟋502

After forming each of the chips, forming first conductive structures, in which the first conductive structure includes a first conductive bump and a first through-silicon via, the first conductive bump is located between first sub-portions of two adjacent chips, the first through-silicon via penetrates through the first sub-portion in the direction perpendicular to the plane of the base and is connected to the first conductive bump, and a material of the first conductive bump is same with a material of the first through-silicon via ⟋503

FIG. 5

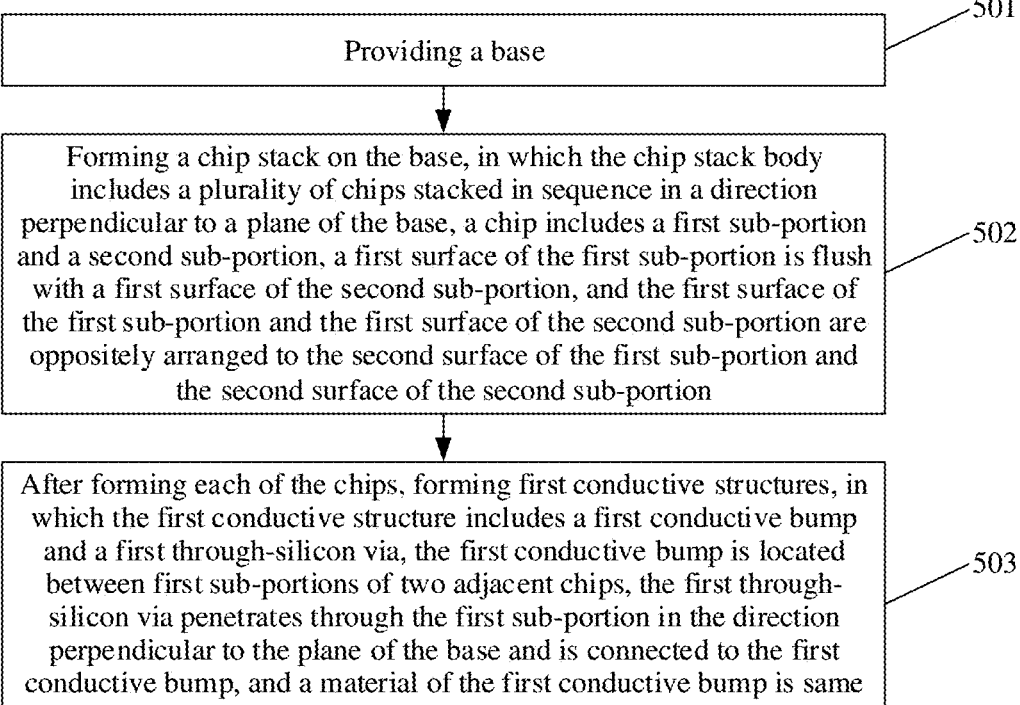

SEMICONDUCTOR STRUCTURE FOR REDUCING RLC PARASITIC PARAMETERS AND MANUFACTURING METHOD THEREOF

CROSS-REFERENCE TO RELATED APPLICATIONS

The present application is a U.S. continuation application of International Application No. PCT/CN2022/123988, filed on Oct. 9, 2022, which claims priority to Chinese Patent Application No. 202211138703.1, filed on Sep. 19, 2022. International Application No. PCT/CN2022/123988 and Chinese Patent Application No. 202211138703.1 are incorporated herein by reference in their entireties.

BACKGROUND

Typically, a high bandwidth memory (HBM) chip can be stacked on an upper surface of a package base. The HBM chip can be electrically connected to the package base via conductive bumps. With the development of 3D package stacking technology, the demand of high bandwidth and low power consumption promotes higher chip stacking and denser through-silicon via (TSV) interconnection. However, the higher the integration level of an HBM, the larger the parasitic parameters of interconnection.

SUMMARY

In view of this, embodiments of the disclosure provide a semiconductor structure and a manufacturing method thereof.

According to a first aspect of embodiments of the disclosure, a semiconductor structure is provided, which includes:
  a base;
  a chip stack located on the base, the chip stack including a plurality of chips stacked in sequence in a direction perpendicular to a plane of the base, in which each of the plurality of chips includes a first sub-portion and a second sub-portion, a first surface of the first sub-portion is flush with a first surface of the second sub-portion, a second surface of the first sub-portion protrudes from a second surface of the second sub-portion, and the first surface of the first sub-portion and the first surface of the second sub-portion are oppositely arranged to the second surface of the first sub-portion and the second surface of the second sub-portion; and
  first conductive structure, each of the first conductive structures including a first conductive bump and a first through-silicon via, the first conductive bump being located between first sub-portions of two adjacent ones of the plurality of chips, and the first through-silicon via penetrating through the first sub-portion in the direction perpendicular to the plane of the base and being connected to the first conductive bump,
  in which a material of the first conductive bump is same with a material of the first through-silicon via.

According to a second aspect of an embodiment of the disclosure, a method for manufacturing a semiconductor structure is provided, which includes:
  providing a base;
  forming a chip stack on the base, in which the chip stack includes a plurality of chips stacked in sequence in a direction perpendicular to a plane of the base, each of the plurality of chips includes a first sub-portion and a second sub-portion, a first surface of the first sub-portion is flush with a first surface of the second sub-portion, a second surface of the first sub-portion protrudes from a second surface of the second sub-portion, and the first surface of the first sub-portion and the first surface of the second sub-portion are oppositely arranged to the second surface of the first sub-portion and the second surface of the second sub-portion;
  after forming each of the plurality of chips, forming first conductive structures, in which each of the first conductive structures includes a first conductive bump and a first through-silicon via, the first conductive bump is located between first sub-portions of two adjacent ones of the plurality of chips, the first through-silicon via penetrates through the first sub-portion in the direction perpendicular to the plane of the base and is connected to the first conductive bump, and a material of the first conductive bump is same with a material of the first through-silicon via.

BRIEF DESCRIPTION OF THE DRAWINGS

In order to more clearly illustrate the technical solutions of the embodiments of the disclosure or that of the related art, the drawings used in the description of the embodiments will be briefly introduced herein below. Apparently, the drawings in the following description are some embodiments of the embodiments of the disclosure, and for those of ordinary skill in the art, drawings of other embodiments can be obtained according to these drawings without making creative efforts.

FIG. 5 is a flowchart of a method for manufacturing a semiconductor structure provided by an embodiment of the disclosure;

FIG. 6A is a first schematic structural diagram of a semiconductor structure provided by an embodiment of the disclosure during a manufacturing process;

DETAILED DESCRIPTION

Figures 1, 2:
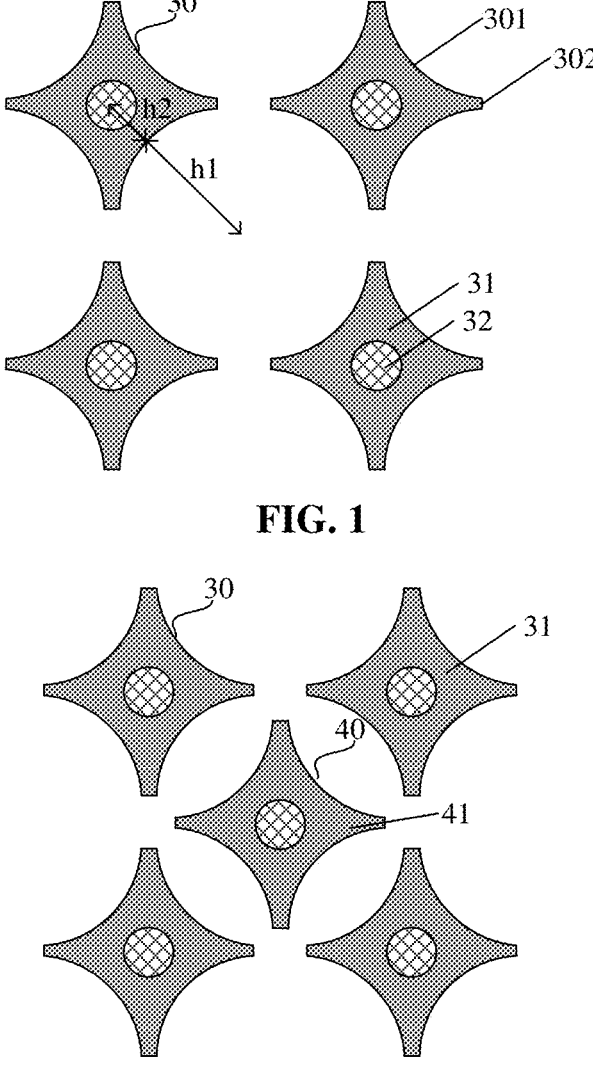
FIG. 1 is a schematic structural diagram of a first conductive structure provided by an embodiment of the disclosure.
FIG. 2 is a schematic structural diagram of a first conductive structure provided by another embodiment of the disclosure.

The disclosure relates to a technical field of semiconductors, and in particular to a semiconductor structure and a manufacturing method thereof.

Exemplary embodiments of the disclosure will be described in more detail below with reference to the accompanying drawings. Although the exemplary embodiments of the disclosure are shown in the drawings, it should be understood that the disclosure may be implemented in various forms and should not be limited by the specific embodiments set forth herein. In contrast, these embodiments are provided to enable a more thorough understanding of the disclosure and to fully convey the scope of the disclosure to a person skilled in the art.

In the following description, numerous specific details are set forth in order to provide a more thorough understanding of the disclosure. However, it is apparent to a person skilled in the art that the disclosure could be implemented without one or more of these details. In other embodiments, in order to avoid confusion with the disclosure, some technical features known in the art are not described. That is, not all features of actual embodiments are described herein, and well-known functions and constructions are not described in detail.

In the drawings, the dimensions of a layer, a region, an element or their relative dimensions may be magnified for clarity. The same reference numeral indicates the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

In order to thoroughly understand the disclosure, detailed operations and detailed structures will be set forth in the following description in order to illustrate the technical solutions of the disclosure. Preferred embodiments of the disclosure are described in detail below; however, the disclosure may have other embodiments in addition to these detailed descriptions.

Embodiments of the disclosure provide a semiconductor structure.

FIG. 1 is a schematic structural diagram of a first conductive structure provided by an embodiment of the disclosure.

As shown in FIG. 1, a first conductive structure 30 includes a first conductive bump 31, the first conductive bump 31 includes at least one concave face 301, concave faces 301 of two adjacent ones of first conductive bumps 31 are oppositely arranged.

In embodiments of the disclosure, when a signal passes through one of first conductive bumps, parasitic RLC will be introduced to other first conductive bumps around due to a fringing field radiation effect, which is inversely proportional to the distance. The farther the distance, the weaker the fringing field radiation effect. Therefore, by arranging the concave faces of two adjacent ones of first conductive bumps oppositely, an overlapping range of fringing fields in space is reduced, thereby reducing the parasitic parameters caused by a fringing field radiation. Moreover, the first conductive bump is configured to include at least one concave face, so that the volume of the first conductive bump is reduced, thereby reducing the parasitic capacitance of the first conductive bump itself.

In an embodiment, first conductive structures 30 are arranged in quadrangles. In a plurality of first conductive structures 30 arranged in each of the quadrangles, concave faces 301 of first conductive bumps 31 of two first conductive structures 30 located diagonally are oppositely arranged.

In this embodiment, the concave faces of the first conductive bumps located diagonally are oppositely arranged, so that the distance between the first conductive bumps is increased, the fringing fields between the first conductive bumps thus are reduced, thereby reducing the RLC parasitic parameters.

In some embodiments, as shown in FIG. 1, first conductive structures 30 are arranged in an orthogonal quadrangle; that is, four conductive structures form a rectangle. In other embodiments, four first conductive structures may form a rhombus or a trapezoid.

In an embodiment, referring to FIG. 1, the first conductive bump 31 further includes at least one convex face 302, and the convex face 302 is adjacent to the concave face 301. By arranging the convex face, the subsequent bonding of the first conductive structures is facilitated, and the bonding quality of the first conductive bumps 31 is ensured.

As shown in FIG. 1, in a plurality of first conductive structures 30 arranged in each of the quadrangles, a first conductive bump 31 of each first conductive structure 30 includes a plurality of concave faces 301, and a convex face 302 is arranged between two adjacent ones of the concave faces 301, and the area of a concave face 301 is greater than the area of the convex face 302.

The arrangement of concave faces aims at increasing the distance between two first conductive bumps, thereby reducing the RLC parasitic parameters. For this reason, the area of the concave face is arranged to be greater to facilitate the reduction of the parasitic parameters. The arrangement of the convex faces aims at facilitating bonding, so the area of the convex face does not need to be too large as long as it facilitates bonding.

In some embodiments, each of the first conductive bumps includes one concave face, and concave faces are oppositely arranged in relation to a center of each quadrangle. In these embodiments, each first conductive bump is provided with only one concave face, but the concave face and a concave face of another first conductive bump are oppositely arranged, so that the parasitic parameters can be reduced to a certain extent; moreover, process operations can be simplified and manufacturing costs can be reduced.

In some other embodiments, the first conductive bump includes two concave faces, and concave faces of two adjacent first conductive bumps are oppositely arranged. In these embodiments, each first conductive bump is provided with two concave faces, so that the parasitic parameters can be further reduced; moreover, because only the two concave faces are provided, an area of a convex face is relatively large, thus increasing a bonding area and ensuring the bonding quality.

In some other embodiments, as shown in FIG. 1, a first conductive bump 31 of each first conductive structure 30 includes a plurality of concave faces 301.

In an embodiment, as shown in FIG. 1, in each of the quadrangles, a distance from a diagonal intersection to a concave face 301 of each first conductive bump 31 is a first distance h1, the distance from the concave face 301 of the first conductive bump 31 to a center of the first conductive bump 31 is a second distance h2, and the ratio of the first distance h1 to the second distance h2 ranges from 5:3 to 5:2.

When the ratio of the first distance to the second distance is set too large, it means that the concave face of the first conductive bump is too close to the center of the first conductive bump, so that the area of the first conductive bump is too small and the conductive performance of the first conductive bump is affected. When the ratio of the first distance to the second distance is set too small, the concave face of the first conductive bump is close to the intersection of diagonal lines, so that the distance between adjacent first conductive bumps is reduced, thereby increasing the parasitic parameters. Therefore, the ratio of the first distance to the second distance is set to 5:3 to 5:2, which not only ensures the conductivity of the first conductive bump, but also reduces the parasitic parameters.

In an embodiment, the first conductive structure 30 further includes a first through-silicon via 32 located on the first conductive bump 31. The first through-silicon via 32 and the first conductive bump 31 ensure subsequent electrical connections between a base and a chip stack, and between adjacent chips.

A conductive material in the first through-silicon via 32 includes, but is not limited to Cu, and the conductive material is wrapped with an insulating material, which includes, but is not limited to $SiO_2$.

In an embodiment, as shown in FIG. 2, the semiconductor structure further includes a second conductive structure 40. The second conductive structure 40 is located at the diagonal intersection of each quadrangle. The second conductive structure 40 includes a second conductive bump 41, which includes at least one concave face.

One second conductive structure 40 is added in the middle of first conductive structures 30 arranged in a quadrangle. A first conductive structure 30 is a signal conductive structure, that is, the first conductive structure 30 transmits a high voltage signal; the second conductive structure 40 is a grounded conductive structure, and the second conductive structure 40 transmits a low voltage signal. During a transmission process, a ground or a power source, whichever is the nearest, is selected as a return path by a signal, and the second conductive structure is close to the first conductive structure, the capacity of electromagnetic flow to the grounded conductive structure (i.e., the second conductive structure) increases, while the capacity flowing to the first conductive structure is relatively reduced, thereby effectively reducing the fringing field effect and reducing the RLC parasitic parameters in return path sections.

In an embodiment, each concave face of the second conductive bump 41 is oppositely arranged to one of concave faces of a first conductive bump 31 adjacent thereto. Due to such an arrangement, the distance between the first conductive bump and the second conductive bump increases, thereby reducing the crosstalk and the parasitic parameters between them.

Figure 4:
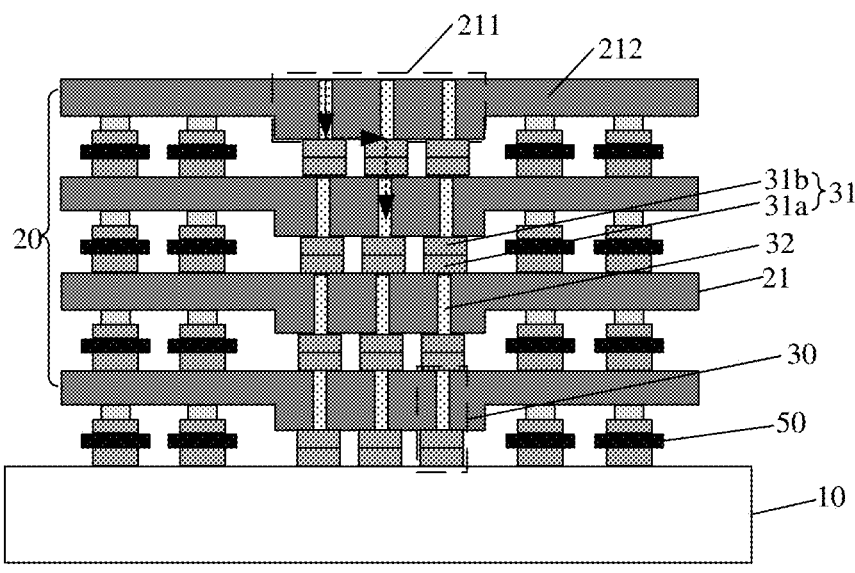
FIG. 4 is a schematic diagram showing a connection between two adjacent chips via a first interconnecting line.

In an embodiment, as shown in FIG. 4, the first conductive structure can be used in a multi-chip stack structure for electrically connecting adjacent chips to improve the connection mode, thereby further reducing the RLC parasitic parameters.

Specifically, in FIG. 4, two adjacent chips 21 may be electrically connected via first conductive bumps 31 and first through-silicon vias 32. The connection mode between adjacent chips in the chip stack structure shown in FIG. 4 is further described below.

Figure 3:
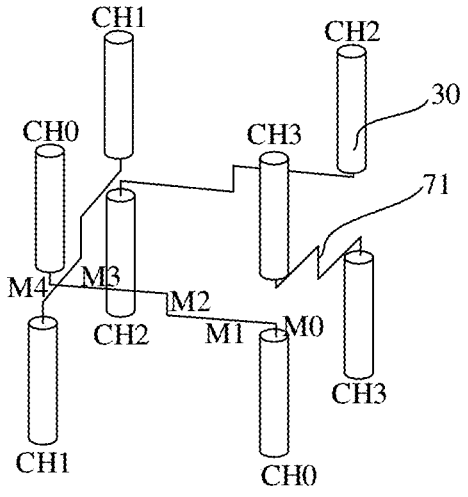
FIG. 3 is a schematic structural diagram of a semiconductor structure provided by an embodiment of the disclosure.

In an embodiment, as shown in FIG. 3 and FIG. 4, a chip stack 20 includes a plurality of chips 21 stacked in sequence, each chip 21 includes n first conductive structures 30, and n is greater than or equal to 2.

On the plane of the base 10, an orthogonal projection of a first through-silicon via 32 from one of two adjacent chips 21 does not overlap with an orthogonal projection of a corresponding first through-silicon via from another of the two adjacent chips.

In the embodiments of the disclosure, the projections of corresponding first through-silicon vias of two adjacent chips do not overlap, indicating that the corresponding first through-silicon vias of two adjacent chips are dislocated at a certain angle, so that a same signal helically rises in the structure formed by stacking the plurality of chips, and the crosstalk between different signals can thus be reduced.

Moreover, the spatial structure is optimized, and a memory with a higher bandwidth can be formed.

In an embodiment, as shown in FIG. 3, the semiconductor structure further includes first interconnecting lines 71, via which corresponding first conductive structures 30 of two adjacent chips 21 are connected. By forming first interconnecting lines 71 in the chips, the connection between first conductive structures 30 when being helically arranged is realized, thereby ensuring the normal transmission of signals.

Specifically, as shown in FIG. 3, for example, each chip can include a plurality of first conductive structures 30, which are CH0, CH1, CH2 and CH3, . . . CH0s of chips are connected via first interconnecting line(s) 71 and helically rise at a certain angle. Likewise, CH1s, CH2s, and CH3s each are connected via first interconnecting line(s) 71 and helically rise at a certain angle. In a same chip, a first interconnecting line for the connection of one of first conductive structures is deflected with a first interconnecting line for the connection of anther one of the first conductive structures at a certain angle, so that an overlapping area between the first interconnecting lines is reduced, thereby reducing the crosstalk between the first interconnecting lines.

In an embodiment, one end of the first interconnecting line is connected to first through-silicon via, and the other end of the first interconnecting line is connected to the first conductive bump.

The first interconnecting line is a metal line. As shown in FIG. 3, it includes metal lines M0 to M4.

As shown in FIG. 3, one end of the first interconnecting line 71 is M0, M0 is connected to a first through-silicon via or a first conductive bump of a first conductive structure of one chip, and the other end M4 is connected to a first conductive bump or a first through-silicon via of a corresponding first conductive structure of an adjacent chip. That is to say, one end is connected to a first through-silicon via, and the other end is connected to a first conductive bump, vice versa. Herein, M0 and M4 are connected via M1, M2 and M3.

It should be explained that, in FIG. 3, the end face of CH0 of the lower chip connected by M0 and the end face of CH0 of the upper chip connected by M4 are in a same horizontal plane. That is to say, the first interconnecting line is parallel to the plane of the chip. Specifically, referring to FIG. 4, a signal is transmitted in the direction indicated by the arrows; that is to say, from a first conductive structure of one chip to a corresponding first conductive structure of an adjacent chip, in which a first interconnecting line is located at the position indicated by the arrow parallel to a plane of the chip.

As shown in FIG. 3, the first conductive structures 30 (e.g., CH0s or CH1s) of the semiconductor structure are helically arranged, rather than vertically arranged, in the stacking direction. That is to say, the distance between corresponding first conductive structures 30 (e.g., CH0s) of two adjacent chips increases. When first conductive structures 30 (e.g., CH0s or CH1s) in the semiconductor structure are vertically arranged, signal crosstalk occurs in all the first conductive structures 30 in the chips due to the fringing field effect. Moreover, since the first conductive structures 30 are vertically arranged, that is, corresponding first conductive structures 30 in two adjacent chips are closer, the crosstalk effect are superimposed. Moreover, with the longer the length of the signal formed by the first conductive structures 30, the stronger the superimposed effect of crosstalk effect, and finally the signal is distorted in the top chip.

However, in the embodiment, since the first conductive structures 30 (e.g. CH0s or CH1s) are helically arranged, that is, the distance of corresponding first conductive structures 30 (e.g., CH0s) of two adjacent chips increases, when crosstalk occurs between two different signals in a same chip, the crosstalk effect is not superimposed on another chip, thereby reducing the influence of crosstalk on signals.

As shown in FIG. 3, a first conductive structure 30 may be a through-silicon via structure, and CH0 and CH1 represent different through-silicon vias (i.e., through-silicon vias that transmit different signals).

In some embodiments, a chip may be further modified to further reduce the RLC parasitic parameters of the semiconductor structure and improve its performance.

In an embodiment, as shown in FIG. 4, the semiconductor structure further includes a base 10 and a chip stack 20. The chip stack is disposed on the base 10 via a plurality of first conductive structures 30. The chip stack 20 includes a plurality of chips 21 stacked in sequence in a direction perpendicular to a plane of the base 10. A chip 21 includes a first sub-portion 211 and a second sub-portion 212. A first surface of the first sub-portion 211 is flush with a first surface of the second sub-portion 212. A second surface of the first sub-portion 211 protrudes from a second surface of the second sub-portion 212. The first surfaces and the second surfaces are oppositely arranged.

In an embodiment, the base 10 may be a printed circuit board (PCB), a re-distribution base, or a logic chip.

As shown in FIG. 4, a first conductive bump 31 of the first conductive structure 30 is located between first sub-portions 211 of two adjacent chips 21, and the first through-silicon via 32 penetrates through the first sub-portion 211 in the direction perpendicular to the plane of the base 10 and is connected to the first conductive bump 31, in which the materials of the first conductive bump 31 and the first through-silicon via 32 are the same.

In the embodiments of the disclosure, because the second surface of the first sub-portion of a chip protrudes from the second surface of the second sub-portion of the chip, the distance between first sub-portions is shortened, so that the first conductive structure having a small size can be used, thereby reducing the RLC parasitic parameters and reducing signal delay. Moreover, the materials of the first conductive bump and the first through-silicon via are the same, so that the problem of signal reflection or even signal distortion caused by impedance mismatch when a signal enters the first conductive bump from the first through-silicon via can be reduced, and the integrity of the signal can be improved.

Specifically, in the embodiment shown in FIG. 4, the first conductive bump 31 includes a first sub-conductive bump 31a and a second sub-conductive bump 31b which are respectively connected to the first sub-portions 211 of two adjacent chips 21.

The first sub-conductive bump and the second sub-conductive bump may be conductive pads.

In an embodiment, the materials of the first conductive bump 31 and the first through-silicon via 32 includes, but is not limited to copper (Cu).

In this embodiment, different chips are bonded by small-sized copper conductive pads instead of a traditional μBump bonding mode, which can greatly reduce the RLC parasitic parameters introduced by μBump bonding and reduce signal delay.

In an embodiment, the structure of the first conductive bump in the embodiment may be formed into a shape including at least one concave face with reference to the structure of the first conductive bump in the embodiment shown in FIG. 1.

In some embodiments, a second conductive structure may be provided in FIG. 4, and the arrangement of the second conductive structure and first conductive structures may refer to FIG. 2.

The connection mode of through-silicon vias in adjacent chips in this embodiment may also refer to the connection mode in the embodiment shown in FIG. 3.

In an embodiment, the semiconductor structure further includes a connection bump 50 located between second sub-portions 212 of chips 21. The connection bump does not play a role of transmitting signals; it mainly plays a role of supporting the chip. Also, it is beneficial to the heat dissipation of the first sub-portions.

Table 1 shows the comparison between simulation data of a semiconductor structure in the related art and that of the semiconductor structure in the embodiments of the disclosure. It should be explained that, in the semiconductor structure of the related art, a first surface of a first sub-portion of a chip is flush with a first surface of a second sub-portion of the chip, and a second surface of the first sub-portion of the chip is also flush with a second surface of the second sub-portion of the chip. That is, the semiconductor structure of the related art does not have a protruding first sub-portion.

TABLE 1

| Comparison of simulation data | | | |
| --- | --- | --- | --- |
| | Frequency (Freq) 1 GHz | | |
| Parameter (Param) | L (pH) | C (fF) | R (mΩ) |
| Semiconductor structure in the related art | 44.21 | 37.29 | 185.31 |
| Semiconductor structure in the embodiments of the disclosure | 17.37 | 30.78 | 25.38 |
| Delta (Δ) | 26.84 | 6.51 | 159.93 |
| Proportion | −60.71% | −17.46% | −86.30% |

From the comparison of stimulation data in Table 1, it can be seen that the parasitic inductance L, parasitic capacitance C and parasitic resistance R of the semiconductor structure in the embodiments of the disclosure are reduced by 60.71%, 17.46% and 86.30%, respectively, compared with those of the semiconductor structure in the related art at the operating frequency of 1 GHz. Therefore, it is demonstrated that the semiconductor structure provided by the embodiments of the disclosure can reduce the parasitic parameters RLC and improve the performance of a device.

In an embodiment, a volume of the first conductive bump 31 is less than a volume of the connection bump 50. Considering that the first conductive bump plays a role of transmitting signals and in order to reduce the parasitic parameters, the first conductive bump is made into a structure with a smaller volume. While the connection bump plays a role of supporting chips, so it is made into a structure with a larger volume.

In an embodiment, a ratio of a height of the first sub-portion 211 to a height of the second sub-portion 212 in the direction perpendicular to the plane of the base 10 ranges from 1.5 to 2.

When the ratio of the height of the first sub-portion to the height of the second sub-portion is too large, the height of the second sub-portion is too less, which leads to less parts on the chip surface that can be used as device structure areas, thereby affecting performance of a device. When the ratio is too small, the height difference between the first sub-portion and the second sub-portion is small, so in order to ensure the small size of the first conductive bump, the distance between chips is small, and the size of the connection bump is also reduced, which may lead to poor support.

In a specific embodiment, the height of the first sub-portion may be 41 μm, and the height of the second sub-portion may be 25 μm.

Embodiments of the disclosure provide a method for manufacturing a semiconductor structure, which is specifically referred to FIG. 5. As shown in the figure, the method includes the following operations.

At S501, a base is provided.

At S502, a chip stack is formed on the base, in which the chip stack includes a plurality of chips stacked in sequence in a direction perpendicular to a plane of the base, in which a chip includes a first sub-portion and a second sub-portion, a first surface of the first sub-portion is flush with a first surface of the second sub-portion, and a second surface of the first sub-portion protrudes from a second surface of the second sub-portion, and the first surfaces and the second surfaces are oppositely arranged.

At S503, after forming each of the chips, first conductive structures are formed, in which each of the first conductive structures includes a first conductive bump and a first through-silicon via, in which the first conductive bump is located between first sub-portions of two adjacent chips, the first through-silicon via penetrates through the first sub-portion in the direction perpendicular to the plane of the base and is connected to the first conductive bump, in which materials of the first conductive bump and the first through-silicon via are the same.

The method for manufacturing a semiconductor structure provided by the embodiments of the disclosure will be described in further detail below in connection with specific embodiments.

FIG. 6A to FIG. 8 are schematic structural diagrams of a semiconductor structure provided by an embodiment of the disclosure during a manufacturing process.

Referring first to FIG. 6A to FIG. 6D, a manufacturing process of a first conductive structure is described in detail.

Figure 6B:
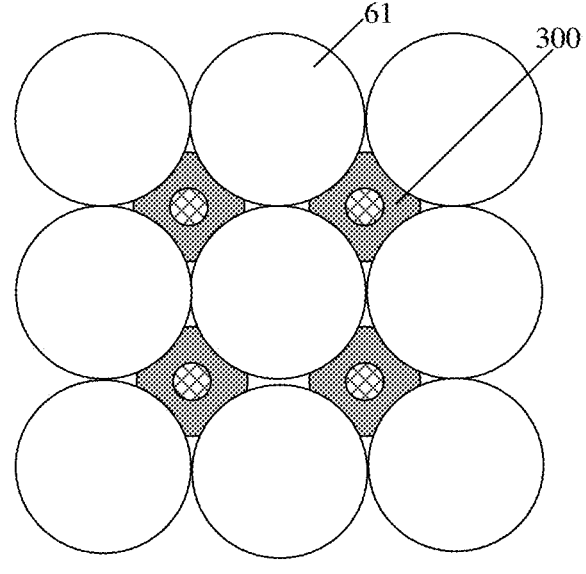
FIG. 6B is a second schematic structural diagram of a semiconductor structure provided by an embodiment of the disclosure during a manufacturing process.
Figure 6C:
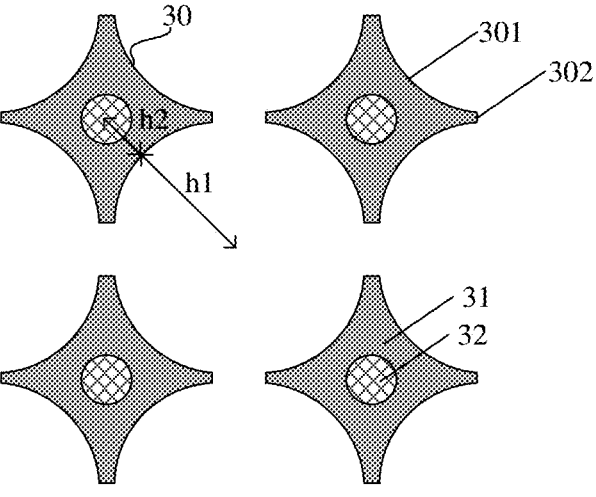
FIG. 6C is a third schematic structural diagram of a semiconductor structure provided by an embodiment of the disclosure during a manufacturing process.

Referring to FIG. 6A to FIG. 6C, forming the first conductive structures 30 includes the following operations.

Initial first conductive structures 300 are formed. Each of the initial first conductive structures 300 includes an initial first conductive bump 310, the shape of initial first conductive bump 310 is a circular.

At least one first mask layer 61 is formed on the initial first conductive bump 310. The first mask layer 61 covers part of a periphery of the initial first conductive bumps 310.

The part of the initial first conductive bump 310 covered by the first mask layer 61 is etched to form the first conductive structure 30.

In an embodiment, the shape of the first mask layer 61 is a circular, such that the first conductive bump formed by removing the part of the initial first conductive bump 310 includes at least one concave face.

It can be understood that the first mask layer may also be other arc-shaped structures.

In an embodiment, first conductive structures 30 are arranged in quadrangles, in first conductive structures 30 arranged in each of the quadrangles, concave faces 301 of first conductive bumps 31 of two first conductive structures 30 located diagonally are oppositely arranged.

In the embodiment, the concave faces of the first conductive bumps located diagonally are oppositely arranged, so that the distance between the first conductive bumps is increased, the fringing fields between the first conductive bumps thus are reduced, thereby reducing the RLC parasitic parameters.

In some implementations, as shown in FIG. 6C, first conductive structures 30 are arranged in an orthogonal quadrangle, i.e. four conductive structures form a rectangle. In other embodiments, four first conductive structures may form into a rhombus or a trapezoid.

In an embodiment, referring to FIG. 6C, the first conductive bump 31 further includes at least one convex face 302, and the convex face 302 is adjacent to the concave face 301. By arranging the convex face, the subsequent bonding of the first conductive structures is facilitated, and the bonding quality of the first conductive bumps 31 is ensured.

As shown in FIG. 6C, in a plurality of first conductive structures 30 arranged in each of the quadrangles, a first conductive bump 31 of each first conductive structure 30 includes a plurality of concave faces 301, and a convex face 302 is arranged between two adjacent ones of concave faces 301, and the area of a concave face 301 is greater than the area of the convex face 302.

The arrangement of concave faces aims at increasing the distance between two first conductive bumps, thereby reducing the RLC parasitic parameters. For this reason, the area of the concave face is arranged to be greater to facilitate the reduction of the parasitic parameters. The arrangement of the convex faces aims at facilitating bonding, the area of the convex face does not need to be too large as long as it facilitates bonding.

In some embodiments, each of the first conductive bumps includes one concave face, and concave faces are oppositely arranged in relation to a center of each quadrangle. In these embodiments, each first conductive bump is provided with only one concave face, but the concave face and a concave face of another first conductive bump are oppositely arranged, so that the parasitic parameters can be reduced to a certain extent; moreover, process operations can be simplified and manufacturing costs can be reduced.

In some other embodiments, the first conductive bump includes two concave faces, and concave faces of two adjacent first conductive bumps are oppositely arranged. In these embodiment, each first conductive bump is provided with two concave faces, so that the parasitic parameters can be further reduced; moreover, because only the two concave faces are provided, an area of a convex face is relatively large, thus increasing a bonding area and ensuring the bonding quality.

In other embodiments, as shown in FIG. 6C, a first conductive bump 31 of each first conductive structure 30 includes a plurality of concave faces 301.

In an embodiment, as shown in FIG. 6C, in each of the quadrangles, a distance from a diagonal intersection to a concave face 301 of each first conductive bump 31 is a first distance h1, the distance from the concave face 301 of the first conductive bump 31 to a center of the first conductive bump 31 is a second distance h2, and the ratio of the first distance h1 to the second distance h2 ranges from 5:3 to 5:2.

When the ratio of the first distance to the second distance is set too large, it means that the concave face of the first conductive bump is too close to the center of the first conductive bump, so that the area of the first conductive bump is too small and the conductive performance of the first conductive bump is affected. When the ratio of the first distance to the second distance is set too small, the concave face of the first conductive bump is close to the intersection of diagonal lines, so that the distance between adjacent first conductive bumps is reduced, thereby increasing the parasitic parameters. Therefore, the ratio of the first distance to the second distance is set to 5:3 to 5:2, which not only ensures the conductivity of the first conductive bump, but also reduces the parasitic parameters.

In an embodiment, the first conductive structure 30 further includes a first through-silicon via 32 located on the first conductive bump 31. The first through-silicon via 32 and the first conductive bump 31 ensure subsequent electrical connections between a base and a chip stack, and between adjacent chips.

A conductive material in the first through-silicon via 32 includes, but is not limited to Cu, and the conductive material is wrapped with an insulating material, which includes, but is not limited to $SiO_2$.

Figures 6D, 7A, 7B, 7C:
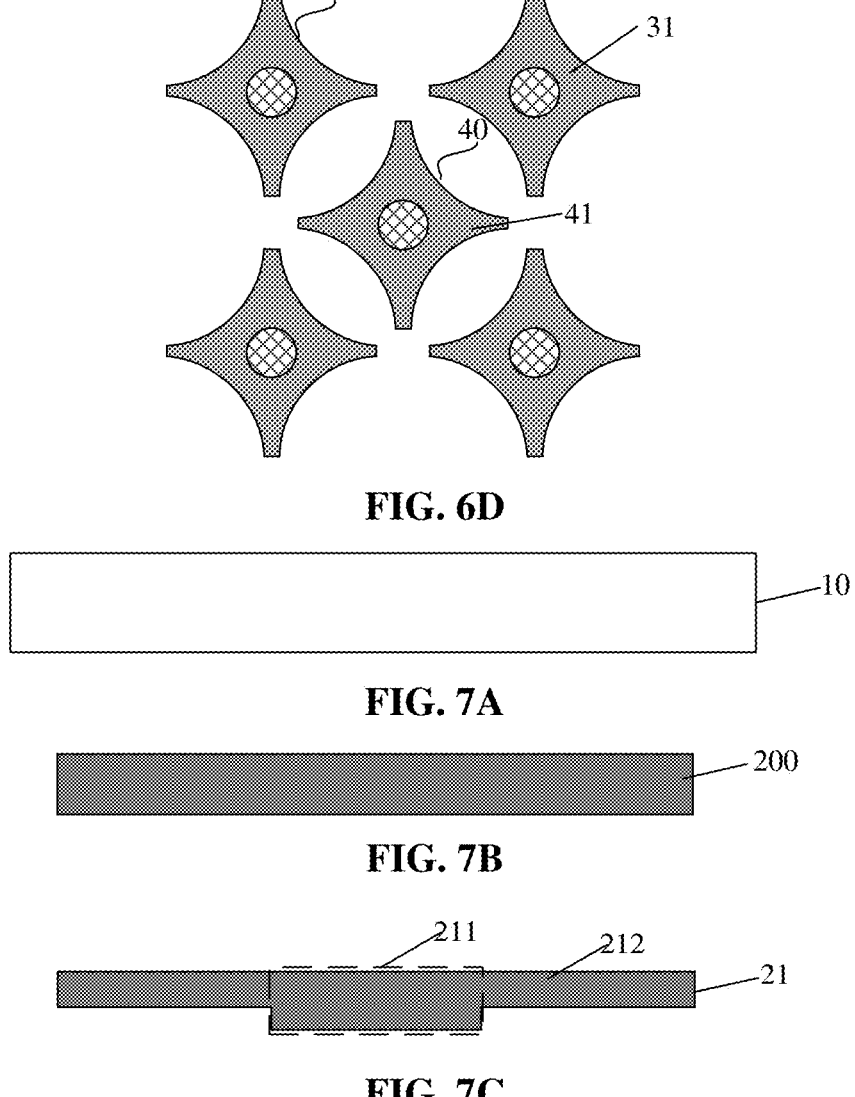
FIG. 6D is a fourth schematic structural diagram of a semiconductor structure provided by an embodiment of the disclosure during a manufacturing process.
FIG. 7A is a fifth schematic structural diagram of a semiconductor structure provided by an embodiment of the disclosure during a manufacturing process.
FIG. 7B is a sixth schematic structural diagram of a semiconductor structure provided by an embodiment of the disclosure during a manufacturing process.
FIG. 7C is a seventh schematic structural diagram of a semiconductor structure provided by an embodiment of the disclosure during a manufacturing process.

Next, referring to FIG. 6D, the method further includes: forming a second conductive structure 40 at the diagonal intersection of each quadrangle. The second conductive structure 40 includes a second conductive bump 41 including at least one concave face.

One second conductive structure 40 is added in the middle of first conductive structures 30 arranged in a quadrangle. A first conductive structure 30 is a signal conductive structure, that is, the first conductive structure 30 transmits a high voltage signal; the second conductive structure 40 is a grounded conductive structure, and the second conductive structure 40 transmits a low voltage signal. During a transmission process, a ground or a power source, whichever is the nearest, is selected as a return path by a signal, and the second conductive structure is close to the first conductive structure, the capacity of electromagnetic flow to the grounded conductive structure (i.e. the second conductive structure) increases, while the capacity flowing to the first conductive structure is relatively reduced, thereby effectively reducing the fringing field effect and reducing the RLC parasitic parameters in return path sections.

In an embodiment, each concave face of the second conductive bump 41 is oppositely arranged to one of concave faces of a first conductive bump 31 adjacent thereto. Due to such an arrangement, the distance between the first conductive bump and the second conductive bump increases, thereby reducing crosstalk between them.

Next, referring to FIG. 7A to FIG. 7D, the first conductive structure manufactured in the above method can be applied to the chip stack to further improve a chip, thereby further reducing the RLC parasitic parameters of the semiconductor structure and improving its performance.

Referring first to FIG. 7A, S501 is performed to provide a base 10.

In an embodiment, the base 10 may be a printed circuit board (PCB), a re-distribution base, or a logic chip.

Figure 7D:
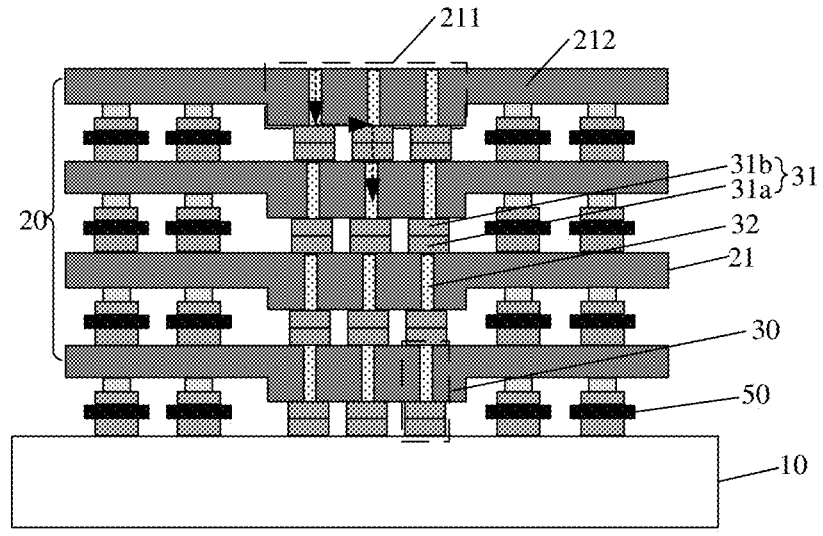
FIG. 7D is an eighth schematic structural diagram of a semiconductor structure provided by an embodiment of the disclosure during a manufacturing process.

Next, referring to FIG. 7B to FIG. 7D, S502 and S503 are performed to form a chip stack 20 on the base 10. The chip stack 20 includes a plurality of chips 21 stacked in sequence in a direction perpendicular to a plane of the base 10. A chip 21 includes a first sub-portion 211 and a second sub-portion 212. A first surface of the first sub-portion 211 is flush with a first surface of the second sub-portion 212. A second surface of the first sub-portion 211 protrudes from a second surface of the second sub-portion 212. The first surfaces and the second surfaces are oppositely arranged.

After forming each of the chips 21, a first conductive structure 30 is formed. The first conductive structure 30 includes a first conductive bump 31 and a first through-silicon via 32. The first conductive bump 31 is located between first sub-portions 211 of two adjacent chips 21. The first through-silicon via 32 penetrates through the first sub-portions 211 in the direction perpendicular to the plane of the base 10 and is connected to the first conductive bump 31. Materials of the first conductive bump 31 and the first through-silicon via 32 are the same.

In the embodiments of the disclosure, because the second surface of the first sub-portion of a chip protrudes from the second surface of the second sub-portion of the chip, the distance between first sub-portions is shortened, so that the first conductive structure having a small size can be used, thereby reducing the RLC parasitic parameters and reducing signal delay. Moreover, the materials of the first conductive bump and the first through-silicon via are the same, so that the problem of signal reflection or even signal distortion caused by impedance mismatch when a signal enters the first conductive bump from the first through-silicon via can be reduced, and the integrity of the signal can be improved.

Specifically, in the embodiment shown in FIG. 7D, the first conductive bump 31 includes a first sub-conductive bump 31*a* and a second sub-conductive bump 31*b* which are respectively connected to the first sub-portions 211 of two adjacent chips 21. The first sub-conductive bump 31*a* and the second sub-conductive bump 31*b* each may also include at least one concave face, thereby further reducing signal crosstalk between them.

The first sub-conductive bump and the second sub-conductive bump may be conductive pads.

In an embodiment, the materials of the first conductive bump 31 and the first through-silicon via 32 includes, but is not limited to copper (Cu).

In this embodiment, different chips are bonded by small-sized copper conductive pads instead of a traditional μBump bonding mode, which can greatly reduce the RLC parasitic parameters introduced by μBump bonding, and reduce signal delay.

In an embodiment, referring to FIG. 7B and FIG. 7C, following operations are included to achieve that the first surface of the first sub-portion 211 is flush with the first surface of the second sub-portion 212, and the second surface of the first sub-portion 211 protrudes from the second surface of the second sub-portion 212.

An initial chip 200 is formed. A second surface (for example, a back surface) of the initial chip 200 is etched to partially remove the initial chip. A part that is not etched serves as the first sub-portion 211, and a part that is etched serves as a second sub-portion 212. The first surface of the first sub-portion 211 is flush with the first surface of the second sub-portion 212, and the second surface of the first sub-portion 211 protrudes from the second surface of the second sub-portion 212.

In an embodiment, the method further includes: after forming each of the chips 21, forming a connection bump 50 on the second sub-portion 212 of the chip 21. The connection bump does not play a role of transmitting signals; it mainly plays a role of supporting the chips. Also, it is beneficial to the heat dissipation of the first sub-portions.

In an embodiment, a volume of the first conductive bump 31 is less than a volume of the connection bump 50. Considering that the first conductive bump plays a role of transmitting signals and in order to reduce the parasitic parameters, the first conductive bump is made into a structure with a smaller volume. While the connection bump plays a role of supporting chips, so it is made into a structure with a larger volume.

In an embodiment, a ratio of a height of the first sub-portion 211 to a height of the second sub-portion 212 in the direction perpendicular to the plane of the base 10 ranges from 1.5 to 2.

When the ratio of the height of the first sub-portion to the height of the second sub-portion is too large, the height of the second sub-portion is too less, which leads to less parts on the chip surface that can be used as device structure areas, thereby affecting performance of a device. When the ratio is too small, the height difference between the first sub-portion and the second sub-portion is small, so in order to ensure the small size of the first conductive bump, the distance between chips is small, and the size of the connection bump is also reduced, which may lead to poor support.

In a specific embodiment, the height of the first sub-portion may be 41 μm, and the height of the second sub-portion may be 25 μm.

In some embodiments, the connection mode of the chips in the chip stack manufactured in the above method may be improved to further reduce the RLC parasitic parameters. Specifically, reference is made to FIG. 8.

Figure 8:
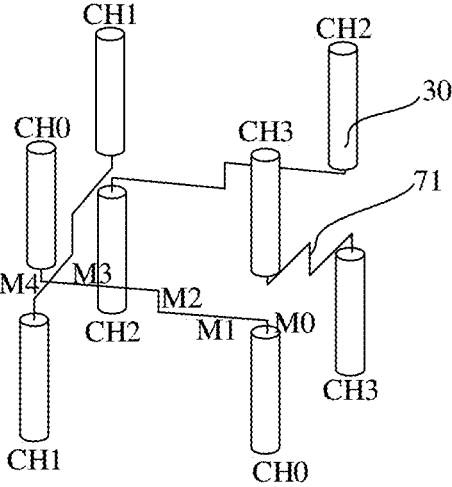
FIG. 8 is a ninth structural diagram of a semiconductor structure provided by an embodiment of the disclosure during a manufacturing process.

Referring to FIG. 8, by way of example, each chip 21 of the chip stack includes n first conductive structures 30, n is greater than or equal to 2. On the plane of the base 10, an orthogonal projection of a first through-silicon via 32 from one of two adjacent chips 21 does not overlap with an orthogonal projection of a corresponding first through-silicon via from anther of the two adjacent chips.

Still referring to FIG. 8, the method further includes forming first interconnecting lines 71 after each chip 21 is formed. Corresponding first conductive structures 30 from two adjacent chips 21 are connected via the first interconnecting line 71.

Specifically, as shown in FIG. 8, for example, each layer of chip can include a plurality of first conductive structures 30, which are CH0, CH1, CH2 and CH3, . . . CH0s of chips are connected via first interconnecting line(s) 71 and helically rise at a certain angle. Likewise, CH1s, CH2s, and CH3s each are connected via first interconnecting line(s) 71, and helically rise at a certain angle. In a same layer, a first interconnecting line for the connection of one of first conductive structures is deflected with a first interconnecting line for the connection of anther one of the first conductive structures at a certain angle, so that an overlapping area between the first interconnecting lines o is reduced, thereby reducing the crosstalk between the first interconnecting lines.

In an embodiment, one end of the first interconnecting line is connected to the first through-silicon via, and the other end of the first interconnecting line is connected to the first conductive bump.

The first interconnecting line is a metal line. As shown in FIG. 8, it includes metal lines M0 to M4.

As shown in FIG. 8, one end of the first interconnecting line 71 is M0, M0 is connected to a first through-silicon via or a first conductive bump of a first conductive structure of one layer of chip, and the other end M4 is connected to a first conductive bump or a first through-silicon via of a corresponding first conductive structure of an adjacent chip. That is to say, one end is connected to a first through-silicon via, and the other end is connected to a first conductive bump, vice versa. Herein, M0 and M4 are connected via M1, M2 and M3.

It should be explained that, in FIG. 8, the end face of CH0 of the lower chip connected by M0 and the end face of CH0 of the upper chip connected by M4 are in a same horizontal plane. That is to say, the first interconnecting line is parallel to the plane of the chip. Specifically, referring to FIG. 7D, a signal is transmitted in the direction indicated by the arrows; that is to say, from a first conductive structure of one layer of chip to a corresponding first conductive structure of an adjacent layer of chip, in which a first interconnecting line is located at the position indicated by the arrow parallel to a plane of the chip.

The above describes only preferred embodiments of the disclosure, and is not intended to limit the protection scope of the disclosure. Any modification, equivalent replacement and improvement made within the spirit and principles of the disclosure shall be included in the protection scope of the disclosure.

In embodiments of the disclosure, because a second surface of a first sub-portion of a chip protrudes from a second surface of a second sub-portion of the chip, a distance between first sub-portions is shortened, so that a first conductive structure having a small size can be used, thereby reducing RLC parasitic parameters and reducing signal delay. Moreover, materials of first conductive bump and first through-silicon via are a same, so that a problem of signal reflection or even signal distortion caused by impedance mismatch when a signal enters the first conductive bump from the first through-silicon via can be reduced, and integrity of the signal can be improved.

The invention claimed is:

1. A semiconductor structure comprising:
a base;
a chip stack located on the base, the chip stack comprising
a plurality of chips stacked in sequence in a direction perpendicular to a plane of the base, wherein each of the plurality of chips comprises a first sub-portion and a second sub-portion, a first surface of the first sub-portion is flush with a first surface of the second sub-portion, a second surface of the first sub-portion protrudes from a second surface of the second sub-portion, and the first surface of the first sub-portion and the first surface of the second sub-portion are oppositely arranged to the second surface of the first sub-portion and the second surface of the second sub-portion;
first conductive structures, each of the first conductive structures comprising a first conductive bump and a first through-silicon via, the first conductive bump being located between first sub-portions of two adjacent ones of the plurality of chips, and the first through-silicon via penetrating through the first sub-portion in the direction perpendicular to the plane of the base and being connected to the first conductive bump,
wherein a material of the first conductive bump is same with a material of the first through-silicon via; and
connection bumps located between second sub-portions of the two adjacent ones of the plurality of chips.

2. The semiconductor structure according to claim 1, wherein a volume of the first conductive bump is less than a volume of a connection bump.

3. The semiconductor structure according to claim 1, wherein in the direction perpendicular to the plane of the base, a ratio of a height of the first sub-portion to a height of the second sub-portion ranges from 1.5 to 2.

4. The semiconductor structure according to claim 1, wherein the first conductive bump comprises a first sub-conductive bump and a second sub-conductive bump, and the first sub-conductive bump and the second sub-conductive bump are connected to the first sub-portions of the two adjacent ones of the plurality of chips, respectively.

5. The semiconductor structure according to claim 1, wherein the material of the first conductive bump and the material of the first through-silicon via comprise copper.

6. The semiconductor structure according to claim 1, wherein the first conductive bump comprises at least one concave face, and concave faces of two adjacent ones of first conductive bumps are oppositely arranged.

7. The semiconductor structure according to claim 6, wherein the first conductive structures are arranged in quadrangles, in a plurality of first conductive structures arranged in each of the quadrangles, and concave faces of first conductive bumps of two first conductive structures located diagonally are oppositely arranged.

8. The semiconductor structure according to claim 7, wherein in each of the quadrangles, a distance from a diagonal intersection to a concave face of each of the first conductive bumps is a first distance, a distance from the concave face of each of the first conductive bumps to a center of a corresponding first conductive bump is a second distance, and a ratio of the first distance to the second distance ranges from 5:3 to 5:2.

9. The semiconductor structure according to claim 7, wherein each of the plurality of chips comprises n first conductive structures, and n is greater than or equal to 2; and
wherein on the plane of the base, an orthogonal projection of a first through-silicon via from one of the two adjacent ones of the plurality of chips does not overlap with an orthogonal projection of a corresponding first through-silicon via from another of the two adjacent ones of the plurality of chips.

10. A method for manufacturing a semiconductor structure, comprising:
providing a base;
forming a chip stack on the base, the chip stack comprising a plurality of chips stacked in sequence in a direction perpendicular to a plane of the base, wherein each of the plurality of chips comprises a first sub-portion and a second sub-portion, a first surface of the first sub-portion is flush with a first surface of the second sub-portion, a second surface of the first sub-portion protrudes from a second surface of the second sub-portion, and the first surface of the first sub-portion and the first surface of the second sub-portion are oppositely arranged to the second surface of the first sub-portion and the second surface of the second sub-portion;
after forming each of the plurality of chips, forming first conductive structures, wherein each of the first conductive structures comprises a first conductive bump and a first through-silicon via, the first conductive bump is located between first sub-portions of two adjacent ones of the plurality of chips, the first through-silicon via penetrates through the first sub-portion in the direction perpendicular to the plane of the base and is connected to the first conductive bump, and a material of the first conductive bump is same with a material of the first through-silicon via; and
forming connection bumps on the second sub-portion of the chip.

11. The method according to claim 10, wherein to form the first sub-portion and the second sub-portion, the method comprises:
forming an initial chip; and
etching a second surface of the initial chip to partially remove the initial chip, wherein a part that is not etched serves as the first sub-portion, a part that is etched serves as the second sub-portion, the first surface of the first sub-portion is flush with the first surface of the second sub-portion, and the second surface of the first sub-portion protrudes from the second surface of the second sub-portion.

12. The method according to claim 10, wherein a volume of the first conductive bump is less than a volume of a connection bump.

13. The method according to claim 10, wherein the first conductive bump comprises a first sub-conductive bump and a second sub-conductive bump, and the first sub-conductive bump and the second sub-conductive bump are connected to the first sub-portions of the two adjacent ones of the plurality of chips, respectively.

14. The method according to claim 10, wherein the material of the first conductive bump and the material of the first through-silicon via comprise copper.

* * * * *